US005940833A

United States Patent [19]
Benson

[11] Patent Number: 5,940,833
[45] Date of Patent: Aug. 17, 1999

[54] COMPRESSING SETS OF INTEGERS

[75] Inventor: Max L. Benson, Redmond, Wash.

[73] Assignee: Microsoft Corporation, Redmond, Wash.

[21] Appl. No.: 08/678,966

[22] Filed: Jul. 12, 1996

[51] Int. Cl.[6] .................................................. G06F 17/30
[52] U.S. Cl. .............................. 707/100; 707/101; 341/51
[58] Field of Search ............................ 341/51, 67; 707/1, 707/101, 102, 200, 100, 2

[56] References Cited

U.S. PATENT DOCUMENTS

| | | | |
|---|---|---|---|
| 3,656,178 | 4/1972 | De Maine et al. | 444/1 |
| 4,606,002 | 8/1986 | Waisman et al. | 364/200 |
| 5,218,699 | 6/1993 | Brandle et al. | 395/650 |
| 5,247,676 | 9/1993 | Ozur et al. | 395/650 |
| 5,274,805 | 12/1993 | Ferguson et al. | 395/600 |
| 5,283,856 | 2/1994 | Gross et al. | 395/51 |
| 5,363,098 | 11/1994 | Antoshenkov | 341/95 |
| 5,406,278 | 4/1995 | Graybill et al. | 341/51 |
| 5,530,957 | 6/1996 | Koenig | 395/600 |
| 5,546,575 | 8/1996 | Potter et al. | 395/600 |
| 5,551,018 | 8/1996 | Hansen | 395/600 |
| 5,551,020 | 8/1996 | Flax et al. | 395/600 |
| 5,585,793 | 12/1996 | Antoshenkov et al. | 341/51 |
| 5,615,366 | 3/1997 | Hansen | 395/607 |

OTHER PUBLICATIONS

Shirley, John and Rosenberry, Ward, "Microsoft RPC Programming Guide", O'Reilly & Associates, 1995.

Kramer, Matt, "Baranof's MailCheck 2.6 Delivers Improved Tools", PC Week, Sep. 11, 1995, Ziff–Davis Publishing Company 1995.

Frenkel, Gary, "cc:Mail View Keeps and Eye on Your Messaging System", Network Computing, Jun. 1, 1995, CMP Publications, Inc., 1995.

*Primary Examiner*—Paul V. Kulik
*Assistant Examiner*—Michael J. Wallace, Jr.
*Attorney, Agent, or Firm*—Workman, Nydegger, Seeley

[57] ABSTRACT

In one aspect, the disclosed technique detects common leading byte patterns in the integers so that these patterns need only be stored once in the encoded byte stream. Those integers that share a common leading byte pattern are stored in truncated form, without their common leading bytes. These truncated integers may themselves be further examined to determine if any of them share additional common leading bytes beyond those already detected. Thus, the technique lends itself naturally to description using the language of trees. Integers with a common leading byte pattern are stored as child nodes, their parent being the node containing the common byte pattern. Child nodes consist only of those bytes remaining after the initial byte pattern has been extracted; the greater the number of children, the greater are the efficiency gains. All the children of a given tree or subtree are similarly examined for common leading byte patterns, ignoring those bytes that are already accounted for in their ancestor nodes. In a second aspect, the disclosed technique makes use of "clustering", a second type of locality that is not reached by the interval concept. A cluster is a sequence of singleton integers that are very close together but do not form a contiguous interval. The technique recognizes that such a cluster can be compactly stored as a bitmap, in which each active bit ("1-bit") represents a member of the cluster. The choice of bitmap size (e.g., 1 byte, 2 bytes, etc.) can be calibrated to suit the clustering characteristics of the input data set.

26 Claims, 11 Drawing Sheets

Microfiche Appendix Included
(6 Microfiche, 543 Pages)

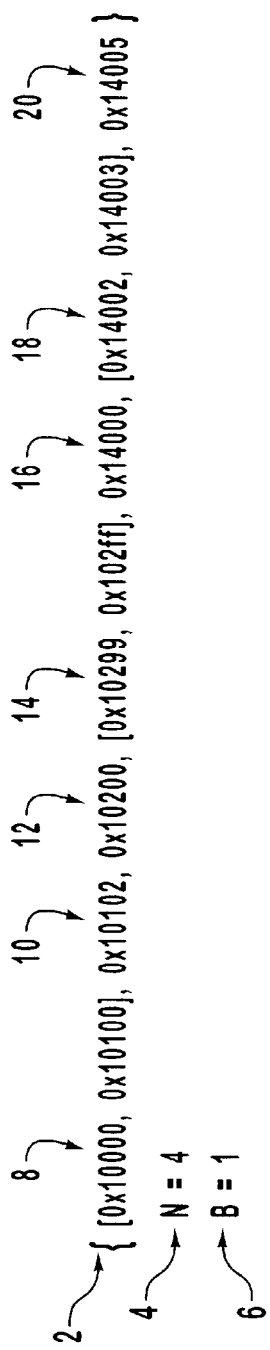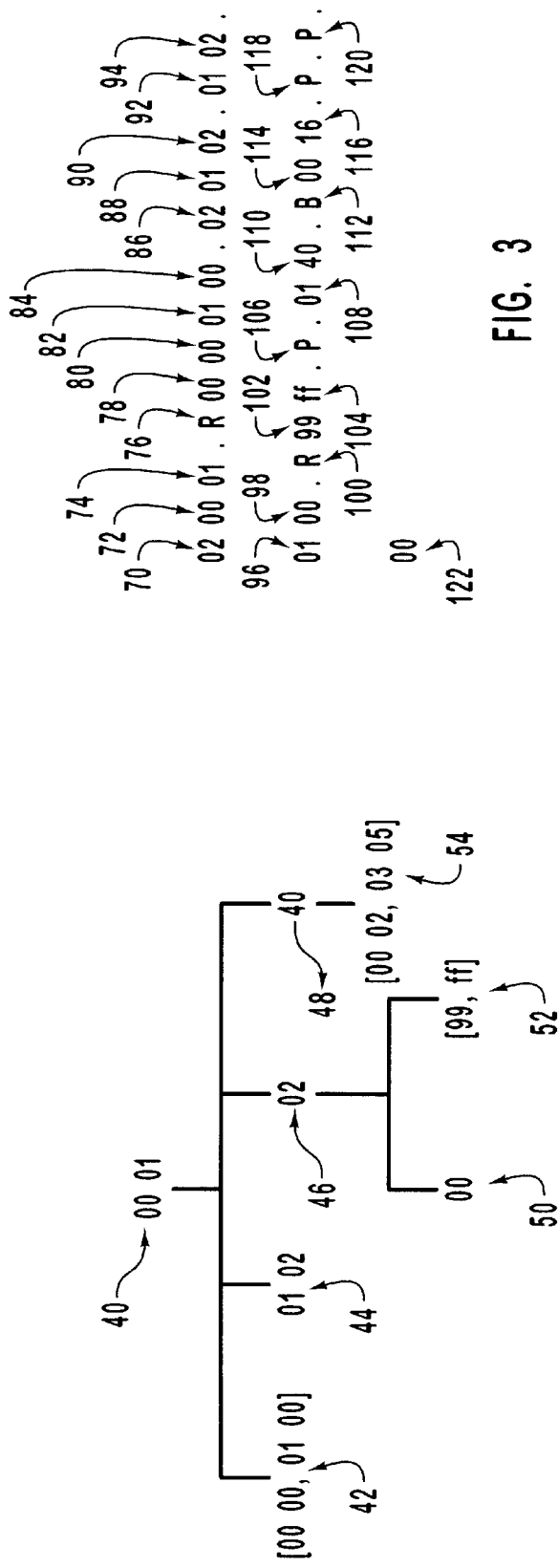

```
EncodeSet( In SET Input_Set )                     360
      Call EncodeForest( Input_Set, 0 )  /
      / Emit termination byte
  362
```

FIG. 7

```
                                            , 370
                                          /        372
EncodeForest( In SET Current_Forest_Set,    /
              In INTEGER Common_Bytes_Encoded )
    Declare SET Unencoded_Forest_Set
   / Unencoded_Forest_Set <-- Current_Forest_Set
 374  While Unencoded_Forest_Set is not empty --,
    Do                                            376
        /- Call EncodeTree( Unencoded_Forest_Set,
     378                    Common_Bytes_Encoded )
    Done
```

FIG. 8

```
                                                390
                                                 /
    EncodeTree( InOut SET Unencoded_Forest_Set,
               In INTEGER Common_Bytes_Encoded )
           Declare BOOLEAN Bitmap_Used              392
           Bitmap_Used <-- FALSE
         ┌ If Common_Bytes_Encoded = N - 1
         │ Then
         │      Declare INTEGER Bitmap_Base
         │      Bitmap_Base <-- Get the low bound of the first interval
         │                      in Unencoded_Forest_Set.
         │      Declare SET Bitmap_Set
         │      Bitmap_Set <-- Get the subset of intervals in
         │                      Unencoded_Forest_Set whose high bound is
         │                      no greater than Bitmap_Base + (B * 8).
         │      If Bitmap_Set contains two or more intervals
         │      Then
         │           Declare BITMAP New_Bitmap
         │           Declare INTEGER Bit
         │           Bit <-- 0
    394 ─┤           While Bit < B * 8
         │           Do
         │                If (Bitmap_Base + Bit + 1) is contained in an
         │                   interval in Bitmap_Set
         │                Then
         │                     Activate bit Bit in New_Bitmap
         │                Endif
         │                Increment Bit by 1
         │           Done
         │           Emit prefix byte for a bitmap
         │           Emit the Nth byte of Bitmap_Base
         │           Emit the B byte(s) of New_Bitmap
         │           Remove Bitmap_Set from Unencoded_Forest_Set
         │           Bitmap_Used <-- TRUE
         │      Endif
         └ Endif
         ┌                            ┌─ 398
         │ If Bitmap_Used is FALSE
         │ Then
         │                                              400
         │      Declare SET Tree_Set                    /
         │      Tree_Set <-- Get the subset of intervals in
         │                   Unencoded_Forest_Set that share at least
         │                   one common leading byte, ignoring the
         │       402         first Common_Bytes_Encoded bytes.
         │        \ If Tree_Set is not empty
         │          Then
         │               ┌ Declare INTEGER New_Common_Bytes
         │               │ New_Common_Bytes <-- Get the number of new common
         │               │                       leading bytes shared by all
    396 ─┤          404 ─┤                       intervals in Tree_Set.
         │               │ Emit New_Common_Bytes as a prefix byte
         │               └ Emit the new common leading bytes
         │           405 ─ Increment Common_Bytes_Encoded by New_Common_Bytes
         │           406 ─ If Common_Bytes_Encoded < N
```

FIG. 9A

```
                Then
        408 ⎯⎯ Call EncodeForest( Tree_Set,
                                  Common_Bytes_Encoded )
        410 ⎯⎯ Emit END-OF-TREE byte
            Endif
412 ⎯⎯ Remove Tree_Set from Unencoded_Forest_Set
    Else
        ⎡ Declare INTERVAL Next_Interval
        │ Next_Interval <-- Get the first interval in
        │                   Unencoded_Tree_Set.
    414 ⎯⎢ Emit prefix byte for a non-singleton interval
        │ Emit the final N-Common_Bytes_Encoded bytes for
        │   the low bound of Next_Interval
        │ Emit the final N-Common_Bytes_Encoded bytes for
        ⎣   the high bound of Next_Interval
    416 ⎯⎯ Remove Next_Interval from Unencoded_Forest_Set
    Endif
Endif
```

FIG. 9B

```
DecodeSet( In BYTESTREAM Encoded_Byte_Stream )
    Declare SET Decoded_Set
    Declare INTEGER Common_Bytes_Decoded
    Common_Bytes_Decoded <-- 0
    Declare STACK State_Stack
    Declare INTEGER Low
    Declare INTEGER High
    Declare BOOLEAN End_of_Stream
    End_of_Stream <-- FALSE
    While End_of_Stream is FALSE
    Do
        Declare BYTE Next_Byte
        Next_Byte <-- Read next byte from Encoded_Byte_Stream.
        Declare INTEGER Count
        If Next_Byte is the termination byte
        Then
            End_of_Stream <-- TRUE
        ElseIf Next_Byte is the END-OF-TREE byte
            Common_Bytes_Decoded <-- Pop State_Stack.
        ElseIf Next_Byte is the non-singleton interval prefix
            Count <-- 1
            While Count <= N - Common_Bytes_Decoded
            Do
                Next_Byte <-- Read next byte from
                                Encoded_Byte_Stream.
                Insert Next_Byte as byte
                    (Common_Bytes_Decoded + Count) in Low
                Increment Count by 1
            Done
            High <-- Low
            Count <-- 1
            While Count <= N - Common_Bytes_Decoded
            Do
                Next_Byte <-- Read next byte from
                                Encoded_Byte_Stream.
                Insert Next_Byte as byte
                    (Common_Bytes_Decoded + Count) in High
                Increment Count by 1
            Done
            Insert [Low,High] into Decoded_Set
        ElseIf Next_Byte is the bitmap prefix
            Next_Byte <-- Read next byte from
                            Encoded_Byte_Stream.
            Insert Next_Byte as byte N in Low
            Declare INTEGER Bitmap_Base
            Bitmap_Base <-- Low
            High <-- Low
            Declare BITMAP Next_Bitmap
            Next_Bitmap <-- Read next B bytes from
                            Encoded_Byte_Stream.
            Declare INTEGER Bit
```

FIG. 10A

```
              Bit <-- 0
              Declare BOOLEAN Low_Bound_Established
              Low_Bound_Established <-- TRUE
              While Bit < B * 8
              Do
                       If bit Bit in Next_Bitmap is activated
                       Then
                                High <-- Bitmap_Base + Bit
                                If Low_Bound_Established is FALSE
                                Then
                                         Low <-- High
                                         Low_Bound_Established <-- TRUE
                                Endif
                       Else
                                If Low_Bound_Established is TRUE
                                Then
                                         Insert [Low,High] into Decoded_Set
                                         Low_Bound_Established <-- FALSE
                                Endif
                       Endif
                       Increment Bit by 1
              Done
              If Low_Bound_Established is TRUE
              Then
                       Insert [Low,High] into Decoded_Set
              Endif
     Else
              Declare INTEGER New_Common_Bytes
              New_Common_Bytes <-- Next_Byte
              Count <-- 1
              While Count <= New_Common_Bytes
              Do
                       Next_Byte <-- Read next byte from
                                     Encoded_Byte_Stream.
                       Insert Next_Byte as byte
                          (Common_Bytes_Decoded + Count) in Low
                       Increment Count by 1
              Done
              If Common_Bytes_Decoded + New_Common_Bytes < N
              Then
                       Push Common_Bytes_Decoded onto State_Stack
                       Increment Common_Bytes_Encoded by
                          New_Common_Bytes
              Else
                       Insert [Low,Low] into Decoded_Set
              Endif
     Endif
Done
```

FIG. 10B

COMPRESSING SETS OF INTEGERS

Appendix A, referred to herein, may be found in the Microfiche Appendix contained in the Patent and Trademark Office File for this patent document. The Microfiche Appendix is comprised of six (6) microfiche having five hundred and forty-three (543) frames.

BACKGROUND OF THE INVENTION

The invention relates to compression techniques that operates on sets of integers so that they may be stored or transmitted efficiently.

Two known techniques for compressing sets of integers are the "array" and "interval" methods. The array method represents the set of integers as an array or list with one element for each integer. In reality, the array method is not really a compression technique at all since the size of the output is identical to that of the input data set. The interval method views the input data set as a set of intervals or ranges; even isolated integers ("singletons") are treated as intervals in which the low bound equals the high bound. The interval method encodes the set as a sequence of intervals, storing the low and high bounds for each interval.

The interval method offers dramatic efficiency gains over the array method when the input data set actually consists of large intervals. However, the interval method breaks down when there are gaps, however small, in the sequence of integers. In fact, the interval method is actually less efficient than the array method when more than half of the set consists of singletons, due to the overhead of representing single points as intervals.

Both the array and interval methods become less efficient as the integer byte representation gets larger. Because they place into the compressed data stream integers of the same size as the integers in the input data set, the number of bytes of the compressed data stream grows linearly as a function both of the number of bytes in the integer representation and of the number of integers or intervals. Even where the integers do not always make use of their full size, these two methods are unable to capitalize on that circumstance.

SUMMARY OF THE INVENTION

The invention departs from earlier techniques in that it examines integers (e.g., database record IDs) at the byte level rather than as irreducible integer quantities. The invention detects common leading byte patterns in the integers so that these patterns need only be stored once in the encoded byte stream. Those integers that share a common leading byte pattern are stored in truncated form, without their common leading bytes. These truncated integers may themselves be further examined to determine if any of them share additional common leading bytes beyond those already detected. Thus, the technique lends itself naturally to description using the language of trees. Integers with a common leading byte pattern are stored as child nodes, their parent being the node containing the common byte pattern. Child nodes consist only of those bytes remaining after the initial byte pattern has been extracted; the greater the number of children, the greater are the efficiency gains. All the children of a given tree or subtree are similarly examined for common leading byte patterns, ignoring those bytes that are already accounted for in their ancestor nodes.

An advantage of byte level examination is that it capitalizes upon a type of "locality" not recognized by the interval concept. Where the actual range of integers comprises a relatively small segment of the full integer domain, the integers will typically all share the same leading byte pattern. For example, it is often the case that database record IDs, though represented by 4- or 8-byte integers, never actually grow large enough to use their highest order bytes. A related advantage is that the encoding scheme does not produce a byte stream whose size is strictly proportional to the number of bytes in the integer representation. Depending on the set composition, the relation between integer size and byte stream size can be constant.

The technique also preferably incorporates an interval concept. Where the set of integers is largely composed of intervals, the combination of interval representation and byte level examination provides powerful efficiency gains.

The invention also makes use of "clustering", a second type of locality that is not reached by the interval concept. A cluster is a sequence of singleton integers that are very close together but do not form a contiguous interval. The invention recognizes that such a cluster can be compactly stored as a bitmap, in which each active bit ("1-bit") represents a member of the cluster. The choice of bitmap size (e.g., 1 byte, 2 bytes, etc.) can be calibrated to suit the clustering characteristics of the input data set.

In general, in a first aspect, for a set of integers, the invention selects a subset of integers that share one or more common leading bytes. This subset of integers is represented in the encoded byte stream by a first and a second group of bytes. The first group represents the common leading bytes of the integers of the subset and comprises a single instance of the common leading bytes. The second group represents the truncated integers of the subset, the truncated integers being the bytes remaining after the common leading bytes have been removed.

In general, in a second aspect, for a set of integers, the invention selects a subset of integers suited for bitmap representation. A reference point is also selected. A bitmap of one or more bytes is created in which the state of a particular bit represents whether a particular integer is contained in the subset and in which the location of the particular bit in the bitmap represents the location of the integer relative to the reference point.

Implementations of the invention may include one or more of the following features.

The set of integers may represent one or more contiguous integers as an interval comprising a low bound and a high bound.

The integers in the set may be arranged in sorted order, and the set may prevent multiple instances of the same integer.

The integers may represent database record IDs.

In representing the subset of truncated integers, in the first aspect, the invention may further examine the truncated integers to select a subset of truncated integers that share one or more common leading bytes. This subset of truncated integers may be represented in the encoded byte stream by a first and a second group of bytes. The first group may represent the common leading bytes of the truncated integers of the subset and may comprise a single instance of the common leading bytes. The second group may represent the further truncated integers of the subset.

The bytes of the encoded byte stream, in the first aspect, may comprise at least one tree, one node, and a plurality of leaves.

The reference point for the bitmap, in the second aspect, may be chosen to be the lowest integer in the subset.

The integer whose location is relative to the reference point, in the second aspect, may be given by the function I(b,r)=r+b+1, where r is the reference point and b is the bit position in the bitmap.

The technique may be applied in many areas, including database replication. Database replication requires that changes to records in one replica be propagated to all other replicas. In particular, records deleted in one location must be similarly deleted in all other locations. This synchronization process is typically achieved by transmitting the set of affected integer record IDs or change numbers, and often other change information, to all the other replicas. The disclosed technique can facilitate this communication by reducing both the size and the time of the transmission, allowing for faster synchronization and therefore more accurate replication.

The invention may be implemented in hardware or software, or a combination of both. Preferably, the technique is implemented in computer programs executing on programmable computers that each include a processor, a storage medium readable by the processor (including volatile and non-volatile memory and/or storage elements), at least one input device, and at least one output device. Program code is applied to data entered using the input device to perform the functions described above and to generate output information. The output information is applied to one or more output devices.

Each program is preferably implemented in a high level procedural or object oriented programming language to communicate with a computer system. However, the programs can be implemented in assembly or machine language, if desired. In any case, the language may be a compiled or interpreted language.

Each such computer program is preferably stored on a storage medium or device (e.g., ROM or magnetic diskette) that is readable by a general or special purpose programmable computer for configuring and operating the computer when the storage medium or device is read by the computer to perform the procedures described in this document. The system may also be considered to be implemented as a computer-readable storage medium, configured with a computer program, where the storage medium so configured causes a computer to operate in a specific and predefined manner.

Other advantages and features will become apparent from the following description, including the drawings and claims.

BRIEF DESCRIPTION OF THE DRAWINGS

FIG. 1 uses set and interval notation to present an example of the type of set on which the encoding method operates.

FIG. 2 is a tree representation of the results of encoding the example set of FIG. 1.

FIG. 3 shows the stream of bytes that results from encoding the example set of FIG. 1.

FIG. 7 is a pseudocode implementation of the top-level routine in a procedural rendering of the encoding method.

FIG. 8 is a pseudocode implementation of the routine that encodes a forest of trees in a procedural rendering of the encoding method.

FIG. 9 is a pseudocode implementation of the routine that encodes a single tree in a procedural rendering of the encoding method.

FIG. 10 is a pseudocode implementation of the decoding method.

DESCRIPTION OF THE PREFERRED EMBODIMENTS

Figure 4:
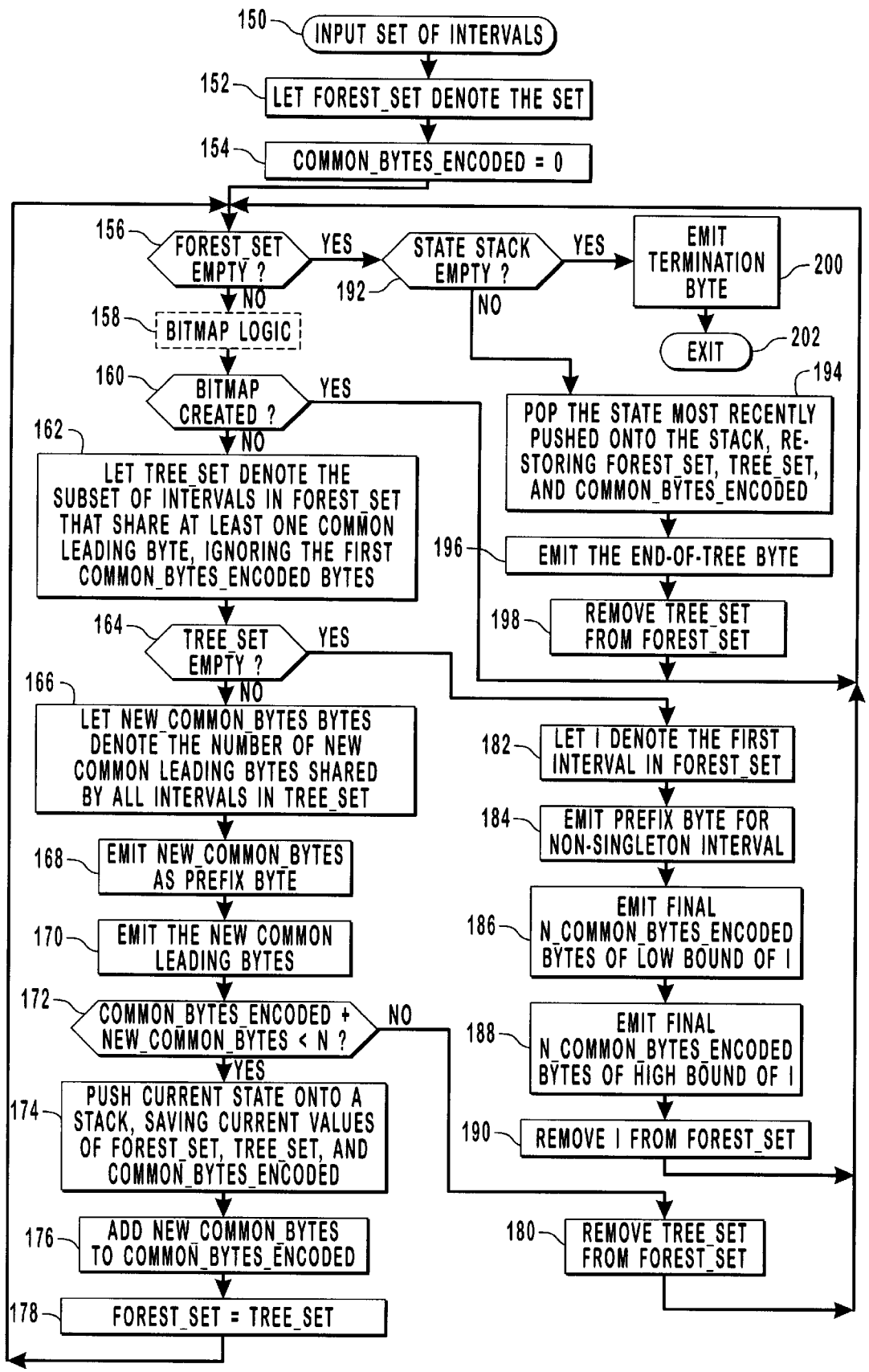
FIG. 4 is a flowchart diagram depicting the method of encoding a set of integer intervals, such as the example set in FIG. 1, into a stream of bytes.

In the preferred embodiment shown in the figures, the encoding scheme operates on a set of intervals (but the invention has broader applicability, e.g., to sets of integers). The sets of intervals could be sets of record IDs or change numbers, e.g., as described in my copending applications entitled, "Replicating Deletion Information Using Sets of Deleted Record IDs," and "Per-User Read/Unread Tracking on a Distributed Database" (both hereby incorporated by reference). An interval is composed of a low and a high bound, each of which is an integer quantity represented on a computer by a fixed number of bytes N. If Low and High are the bounds of an interval, they satisfy the relation: Low<=High. It is possible for an interval to consist only of a single member (i.e., when Low equals High). Such a degenerate interval is called a "singleton." References to intervals are intended to include both singleton and non-singleton intervals, unless specifically qualified.

In the preferred embodiment, the set and any subsets derived therefrom are expected to be in sorted ascending order of intervals. Although ascending order is preferred, it is not required. It would be equally plausible to implement the method to expect descending order sets. The advantage of ascending order is that it results in a slightly more intuitive embodiment.

The preferred embodiment also assumes that the interval sets obey all the fundamental properties of ordinary mathematical sets, including the property of uniqueness. There can be no duplicate integers, no overlapping of intervals, in the interval sets. In a typical replicated database environment, for example, database record IDs satisfy this uniqueness constraint. It would be possible to relax the uniqueness constraint, but at the cost of greater complexity and less efficiency because, e.g., the software would likely be forced to encode information about the number of instances of each integer.

The preferred embodiments utilize a tree abstraction to describe both the technique and the encoded result. FIGS. 4 through 10 depict the steps of the technique using the language of trees (e.g., forests, nodes, parents, children). FIG. 2 shows the tree representation of the result of encoding the example set in FIG. 1. The example set consists of 4-byte integers, as indicated in FIG. 1 by N=4. For purposes of presentation, the integers are shown in hexadecimal (or hex) notation. Although a 4-byte integer is fully represented using eight hex digits, it is conventional in the notation to omit leading zero digits. Thus, each integer in the example set, though shown in FIG. 1 with only five hex digits, would actually begin with an additional three zero digits if shown in full hex format.

Each tree contains a subset of intervals all of which share at least one common leading byte. A tree begins with a root or parent node that holds the bytes common to all children of that tree. FIG. 2 shows one main tree; the top-level node 40 is the root of this tree in which all intervals begin with the two bytes '00 01'. A tree can have subtrees as well as leaves.

In FIG. 2, node 46 is the root of a tree that is a subtree of the main tree introduced by node 40; within this subtree, the intervals share not only their first two bytes but also their next byte '02'. Node 44 is one example of a leaf; it represents the singleton 10 0x10102 because its first two bytes are '00 01' and its next two are '01 02'. Node 52 is another leaf node; it represents the interval 14 [0x10299, 0x102ff] because its ancestry (i.e., its parent, its parent's parent, etc.) supplies the first three bytes '00 01 02' and the leaf itself supplies the final byte for either bound of the interval ('99' for the low bound and 'ff' for the high bound). Finally, node 54 is also a leaf node; it represents a bitmap of three intervals 16, 18, 20.

Note that FIG. 2 shows only one main tree for the entire example set (FIG. 1). This is because all the intervals in the example set share their first two bytes. If the set contained another interval, say [0x01000000, 0x010011ff], that did not have '00' as its first byte, there would be two separate top-level trees; the second tree would contain this new interval. A collection of sibling trees is called a "forest." Although the example set results in the creation of only one main tree, in general the input set will be encoded as a forest. Note that the children of a parent node also comprise a forest. In FIG. 2, nodes 42 through 48 comprise the child forest of node 40. Thus, a forest consists of trees, each of whose children comprise a forest containing trees.

The encoding method as depicted in FIG. 4 is a "straight-line" or sequential step embodiment; it may also be categorized as iterative. Essentially the same method is embodied in FIGS. 7 through 9 as a procedural implementation using function call semantics and recursion.

The straight-line method begins with the input interval set (step 150 in FIG. 4). At the top level, the input set is viewed as a forest (Forest_Set) of one or more trees to be encoded (step 152). The method then enters its main loop at step 156, where it remains until all intervals in the set have been encoded. The loop tests Forest_Set at each iteration to see if it is empty (step 156). Consider as the input set the example interval set 2 in FIG. 1. This set contains 4-byte integers, as indicated in FIG. 1 by N=4. At this point, Forest_Set is not empty (steps 152 and 156).

Figure 5:
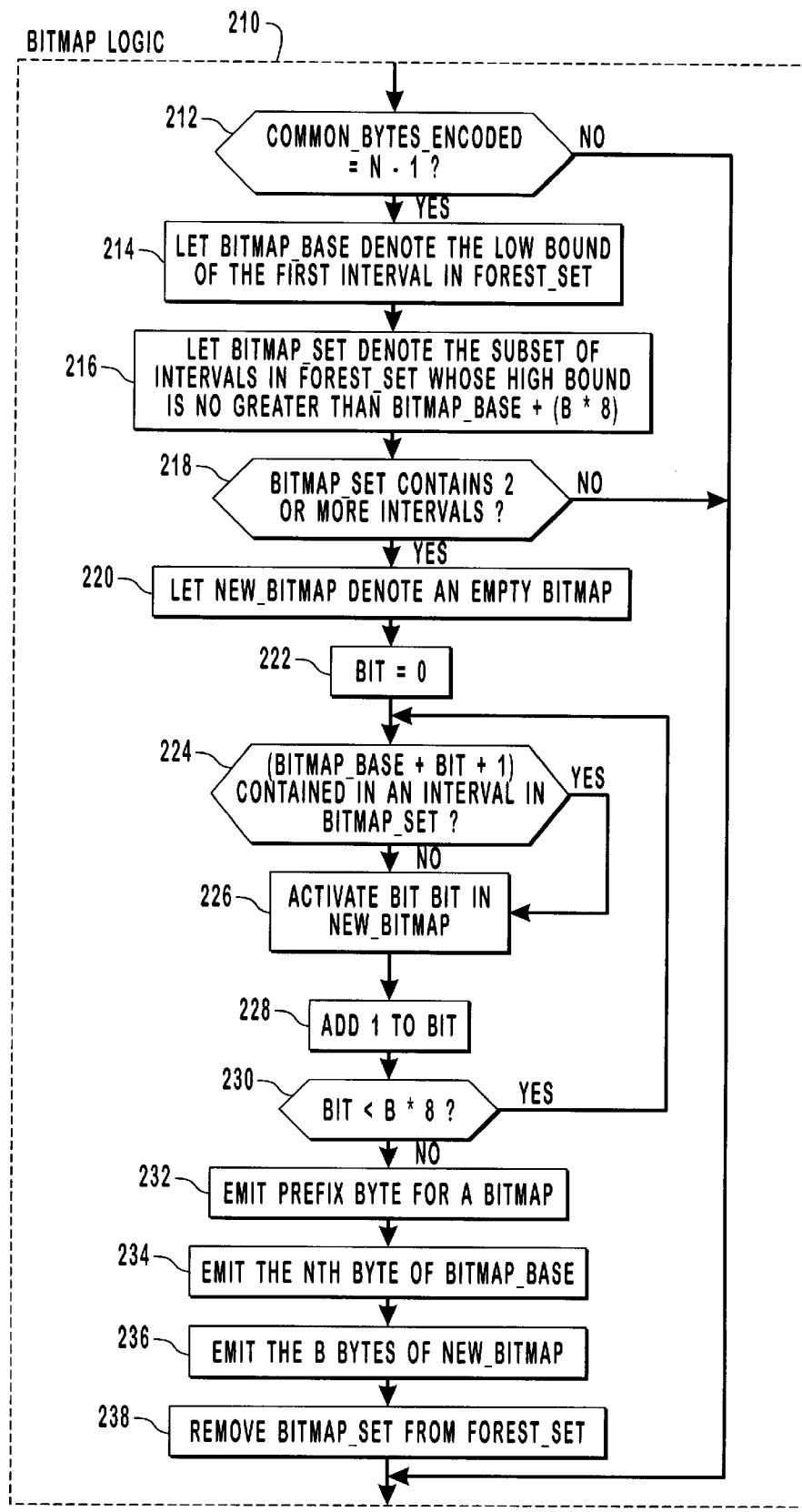
FIG. 5 is a flowchart diagram depicting the steps for encoding a bitmap as part of the encoding method as depicted in FIG. 4.

Step 158 in FIG. 4 begins a sequence of steps intended to determine what type of tree node to create. The first step is to see if a bitmap node should be created (step 156). The bitmap logic consists of many steps itself, the details of which are shown in FIG. 5. In the preferred embodiments, a bitmap node is not even considered unless there is only one byte left to encode at the current tree level. This is based on the expectation that the bitmap size (B) is not very large, in particular no greater than 32 bytes. In the example, the bitmap size is 1 byte, as indicated in FIG. 1 by B=1. However, there is no inherent limit on the bitmap size. There could be applications for which a bitmap size greater than 32 bytes is appropriate. When the bitmap size exceeds 32 bytes, it would be possible for a person skilled in the art to alter the encoding scheme to consider creating a bitmap node when there are one or two bytes left to encode.

The number of bytes encoded for the intervals in Forest_Set at the current tree level is maintained in Common_Bytes_Encoded, which is initialized to 0 when the method begins (step 154 in FIG. 4). Common_Bytes_Encoded is tested (step 212 in FIG. 5) to see if only one byte remains. In the example, no bytes have been encoded yet, so the test fails. If the test fails, the method exits the bitmap logic 210 and continues with step 160 in FIG. 4. This step tests whether a bitmap node was actually created; if so, the method returns to the top of the main loop to continue processing the rest of the forest set. No bitmap was created in the example, so the method proceeds to the core of the encoding scheme starting with step 162.

The core of the encoding scheme is its examination of the set for common leading bytes; from Forest_Set it forms a subset of intervals that share at least one common leading byte (step 162). If any common leading bytes have already been encoded in a parent tree node, they are ignored in this examination; only new or additional common leading bytes are significant. This treatment of previous common leading bytes effectively truncates the integers in the intervals so that they appear to consist of only their remaining bytes. The preferred embodiments conceptually perform the truncation through manipulation of the variable Common_Bytes_Encoded rather than literally truncate the intervals; literal truncation is an alternative, although it would likely be less efficient. In the example, Common_Bytes_Encoded is still zero, so the step begins its examination with the very first byte. Since all of the intervals in the example begin with the same two bytes (00 and 01), Tree_Set (step 162) contains all the intervals of Forest_Set. Because Tree_Set is not empty (step 164), the method emits a new tree node containing the common bytes (steps 166 through 170). FIG. 2 shows the abstract tree representation of the new node 40. A prefix byte is emitted (step 168) so that the decoding scheme will know how many bytes to read from the encoded byte stream when it reconstructs that node.

When a tree node of common bytes is created, there are always two possibilities. If the sum of Common_Bytes_Encoded and New_Common_Bytes is still less than N (step 172), then there are still more bytes to encode for the intervals in Tree_Set; the node just created is the parent node of a new tree having at least one child node. The other possibility is that the sum above equals N, indicating that the node just created is actually a leaf node representing a singleton. In the example, only two of the four bytes have been encoded, so there will be child nodes. The child nodes will represent all of the intervals in Tree_Set; that is, Tree_Set is the forest of trees under the parent node just created. Accordingly, the method changes context by redefining Forest_Set to be Tree_Set (step 178) and by changing Common_Bytes_Encoded to include the new common bytes encoded in the tree node just created (step 176). However, this change of context is only operative while encoding the child forest of the new tree. Once the new tree has been completely encoded, the method must continue encoding the remainder of the original Forest_Set. Therefore, the current context or state must be saved so that it may later be restored. Because a tree may have multiple levels, the method uses a stack abstraction to manipulate states in a LIFO (last in, first out) manner. Thus, the current state consisting of the values of Forest_Set, Tree_Set, and Common_Bytes_Encoded is pushed onto the stack (step 174) for later retrieval. Then, the context is changed (steps 176 through 178), and control returns to the top of the main loop so that this new child forest may be encoded.

Steps 156 through 160 in FIG. 4, including the detailed bitmap steps in FIG. 5, proceed just as before. The set is examined for any common leading bytes beyond the two that have already been encoded in the ancestry of the current forest (step 162). In the example, the first interval 8 has no new common leading bytes between its low and high bounds; therefore, not even one interval has common leading bytes, and Tree_Set is empty (steps 162 through 164). Tree_Set is empty precisely when the first interval has no more common bytes, meaning that the method must now create a leaf node for the interval. Note also that the interval cannot be a singleton because the low and high bounds of a singleton by definition share all N bytes in common. Thus, a non-singleton interval node is created for the first interval in Forest_Set (steps 182 through 188). The new node contains the remaining bytes for the low bound, followed by the remaining bytes for the high bound. FIG. 2 shows the abstract tree representation of the new interval node 42. A prefix byte is emitted (step 184) so that the decoding scheme will know that the next node is a non-singleton interval node. As a final step before returning to the top of the main loop, the interval just encoded is removed from Forest_Set (step 190) so that it is eliminated from consideration in further encoding. There are different ways to accomplish this elimination. The preferred embodiments mutate the set directly. Another possibility would be to create a new subset rather than mutate the set directly. Direct mutation is the more efficient of the two approaches. Even direct mutation could be implemented in one of several ways. The most intuitive approach would be to physically mutate the set by actually removing the interval. This approach has the advantage of simplicity, and would probably appeal to those skilled in the art who follow an object-oriented software design methodology. A second approach is to maintain a count of the intervals in the current forest that have been encoded, and to treat the set as if it started with the first interval that has not yet been encoded. The same could be accomplished by using a "pointer" construct, such as is found in the C programming language, to represent the set. The pointer starts out by pointing to the first interval; after that interval has been encoded, the pointer is advanced to the next interval. The counter and pointer approaches are probably the most efficient ways to conceptually implement the set mutation. In addition, they have the advantage of not physically mutating the set data, which for many of those skilled in the art is an important consideration.

Steps 156 through 160 in FIG. 4 proceed as before. On this iteration, Tree_Set consists of one interval, the first singleton 10 of the example, whose bounds share their remaining two bytes. No other intervals in the example share any new common leading bytes with that singleton. Since Tree_Set is not empty (step 164), a new tree node is emitted containing the two new common leading bytes (steps 166 through 170). This time, however, there are no bytes remaining (step 172) and consequently no children. The singleton interval is then removed from further consideration (step 180), and control returns to the top of the main loop.

Steps 156 through 160 in FIG. 4 proceed as before. On this iteration, Tree_Set consists of the next singleton 12 and the next interval 14 in the example, as they have their next byte (02) in common. Since Tree_Set is not empty (step 164), a new tree node is emitted containing the new common leading byte (steps 166 through 170). FIG. 2 shows the abstract tree representation of the new node 46. Since the sum of Common_Leading_Bytes and New_Common_ Bytes is only 3 (step 172), the context is changed to encode the child forest of the new tree node (steps 174 through 178). Note that this is the second time the context has been changed, and the stack has two entries. This corresponds to the fact that the method has reached the second depth level of the tree in FIG. 2. The new context having been established, control returns to the top of the main loop.

On this iteration, the bitmap logic (step 158 in FIG. 4 and step 210 in FIG. 5) proceeds a little further because there is in fact only one byte remaining (step 212), as Common_ Bytes_Encoded is currently at 3. The bitmap logic then looks for a cluster of intervals by establishing a base (step 214) and then searching for all intervals that are fully contained within a certain distance from that base (step 216), "distance" being convenient shorthand for the difference between the base and the integer in question. The allowable distance is a function of the bitmap size; the example uses one-byte bitmaps, as indicated in FIG. 1 by B=1 6. Because each byte by definition has 8 bits, a bitmap can represent up to 8 integers per byte, one bit for each unit distance from the bitmap base. Thus, a one-byte bitmap can accommodate integers no greater than Bitmap_Base+8. In the example, the base is given by the singleton 0x10200 12. The next interval 14 has a low bound of 0x10299, much greater than 8 from the base. So Bitmap_Set (step 216) contains only the singleton. Since bitmaps are a less efficient representation when only one interval is included, a bitmap will only be created when two or more intervals are involved (step 218). Because the test fails here, the bitmap logic exits, and the method proceeds through to the byte examination in step 162 in FIG. 4. The only common leading bytes between the two intervals currently in Forest_Set belong to the singleton 12. Thus, steps 162 through 180 in FIG. 4 proceed just as they did for the singleton node 44 created earlier. FIG. 2 shows the abstract tree representation of the new singleton node 50. The next loop iteration handles the remaining non-singleton interval 14 in the current Forest_Set. Although the fact that only one byte remains qualifies this next node for bitmap consideration (step 212 in FIG. 5), the fact that only one interval is in the set necessarily means that the test for more than one interval will fail (step 218). Since there are no new common leading bytes shared by the interval's low and high bounds, Tree_Set is empty (steps 162 through 164 in FIG. 4), and a new non-singleton interval node is emitted (steps 182 through 190) in the same way that the very first interval 8 was encoded. FIG. 2 shows the abstract tree representation of the new non-singleton interval node 52. Control returns to the top of the main loop.

Now that both intervals in the current Forest_Set have been encoded, Forest_Set is empty (step 156 in FIG. 4). The top of the stack is popped (step 194) to restore the context that existed before the last tree was encoded. Thus Forest_ Set reverts to its prior composition (intervals 12 through 20 in the example), and Common_Bytes_Encoded is restored to 2. These settings are consistent with the state of the encoding at the first depth level of the top-level tree in FIG. 2. In addition, Tree_Set is restored to consist of the intervals 12, 14 that were just encoded in the last tree. An END-OF-TREE byte is emitted (step 196) so that the decoding scheme will know that the tree has ended and that a new tree begins with the next byte. Finally, the intervals in Tree_Set are removed from Forest_Set to eliminate them from further consideration. Control can now return again to the top of the main loop, with Forest_Set currently containing intervals 16 through 20.

The method proceeds through steps 156 through 160 in FIG. 4 to arrive once again at the byte examination of step 162 in FIG. 4. This time, all three intervals share a common leading byte (40). Tree_Set therefore not being empty, a new tree node is emitted with the common leading bytes. FIG. 2 shows the abstract tree representation of the new tree node 48. Since one byte remains to be encoded (step 172), the context is pushed onto the stack and a new context established (steps 174 through 178) before control returns to the top of the main loop.

Since only one byte remains (Common_Bytes_Encoded is currently at 3), the intervals qualify for bitmap representation (step 212 in FIG. 5). Bitmap_Base is 0x14000 (step 214) in the example. Note that the base need not be a singleton; it is defined as the low bound of the first interval in the set. Each of the remaining two intervals 18, 20 are within 8 of the base, so Bitmap_Set passes the membership test (steps 216 through 218). Steps 212 through 218, in which an interval qualifies for bitmap representation and the interval passes the membership test, represent a specific, non-limiting example of selecting a subset of integers suited for bitmap representation. Similarly, identifying Bitmap_Base for the interval that satisfies the conditions of steps 212 through 218 represents a specific, non-limiting example of selecting a reference point from which the bitmap is to be referenced. The next set of steps (steps 220 through 230) construct the bitmap using a looping construct. As Bit varies from 0 to 7 (steps 222, 228, and 230), Bitmap_Set is tested to see if any interval contains the integer Bitmap_Base+Bit+1 (step 224). If so, the bitmap bit is turned on at the position indicated by Bit; bit positions are numbered 0 through 7 in the case of a one-byte bitmap. Steps 222 through 230 represent a specific, non-limiting example of creating a bitmap of one or more bytes in which the state of a particular bit represents whether a particular integer is contained in the subset that the bitmap represents. The location of the particular bit in the bitmap represents the location of the integer relative to the reference point. Furthermore, the function I(b,r)=r+b+1, where r is the reference point and b is the bit position in the bitmap, defines the value I of the integer represented in the bitmap. The example bitmap cluster demonstrates that both singleton and non-singleton intervals may be represented in a bitmap; each integer in an interval is represented by a different bit in the bitmap. Once the bitmap has been assembled, a bitmap node is emitted (steps 232 through 236). FIG. 2 shows the abstract tree representation of the bitmap node 54. A prefix byte is emitted (step 232) so that the decoding scheme will know that the next node is a non-singleton interval node. The final byte of the bitmap base is also emitted (step 234), since the bitmap itself represents the members of the bitmap cluster exclusive of the base. The base is also needed by the decoding scheme as the anchor relative to which the cluster is reconstructed. With the bitmap node emitted, the intervals of Bitmap_Set are removed from Forest_Set to eliminate them from further consideration, and control returns to the top of the main loop.

At this point, Forest_Set is now empty (step 156 in FIG. 4). The state stack has two entries, the top being the context that existed before the tree with the child bitmap node was encoded. That top context is popped (step 194) and an END-OF-TREE byte is emitted (step 196). Forest_Set and Tree_Set are identical, as they were before; both contain the final three singletons 16, 18, and 20 in the example. Also, Common_Bytes_Encoded is restored to 2. When Tree_Set is removed from Forest_Set, the result is an empty forest. On the next loop iteration, the empty set is detected (step 156), the state stack is popped again (steps 192 through 194), and another END-OF-TREE byte is emitted (step 196). This last pop empties the stack and restores the context that existed before any common leading bytes were encoded; Forest_Set is the entire original input set and Common_Bytes_Encoded is at 0. Since all intervals in the set were encoded in the one and only top-level tree, Tree_Set is also identical to the original input set. When Tree_Set is removed from Forest_Set, the result is an empty forest. Note that it is possible for the top-level forest to consist of more than one tree, in which case Forest_Set would not be empty at this point. However, in the example all intervals share the first two bytes and are therefore represented in a single tree. The loop iterates one final time, detects the empty set (step 156), and detects the empty stack (step 192). Now that all intervals have been encoded, a termination byte is emitted (step 200) so that the decoding scheme knows that no more intervals follow, and the method exits (step 202).

FIG. 3 shows the sequence of bytes that results by appending all the byte emissions described in the run-through of the example above. The dots 124 are not actually part of the byte sequence but are placed to delimit tree nodes for presentation purposes. The 'R' 76 is the prefix byte for a non-singleton interval, also called a "[r]ange." The 'B' 112 is the prefix byte for a bitmap interval. The 'P' 106 is the END-OF-TREE byte, indicating that it is time to pop the state stack. The final '00' 122 is the termination byte. Note that the choice of values for these various special bytes is completely flexible, except for one condition. They cannot overlap with the allowable range of prefix bytes used to indicate the number of common bytes in a parent node. The number of common bytes can range from 1 to N. Keep in mind that the "letter" prefixes are really just bytes on the computer that are interpreted as alpha characters according to a standard such as ASCII, so ambiguity could arise for an N large enough to include the byte representation of a "letter" prefix. Under ASCII, the most common standard, it would be extremely unusual to use integers so large that N exceeds any alpha character.

FIGS. 7 through 9 show another preferred embodiment of the encoding scheme. The embodiment uses a procedural design with function-call semantics and recursion to implement essentially the same steps as in the straight-line embodiment just discussed. FIG. 7 shows the top-level routine EncodeSet that operates on the input interval set. It views the input set as a forest to be encoded, and calls EncodeForest to do the encoding (step 360 in FIG. 7). Once the top-level forest has been encoded, the termination byte is emitted (step 362 in FIG. 7), and the method exits.

FIG. 8 shows the EncodeForest routine. EncodeForest implements the skeleton of the main loop of the straight-line embodiment (step 156 in FIG. 4). Given a forest (step 370 in FIG. 8), it encodes each tree by calling EncodeTree (step 378 in FIG. 8) repeatedly until all intervals in the forest have been encoded (step 376 in FIG. 8). The number of common leading bytes already encoded by the ancestry of this forest is indicated by Common_Leading_Bytes, which is given to the routine (step 372 in FIG. 8) and is zero for the top-level forest (step 360 in FIG. 7). Note that EncodeForest is also called recursively by EncodeTree to encode the child forest under a parent tree node (step 408 in FIG. 9). There is no need to maintain a state stack as was done in the straight-line embodiment because function call semantics accomplish the same result automatically.

EncodeTree is the workhorse of the procedural embodiment and covers the remainder of the steps (steps 158 through 172, 180 through 198 in FIG. 4; steps 212 through 238 in FIG. 5) in the straight-line embodiment. It is responsible for determining which intervals in a given forest will comprise the next tree, for encoding that tree, and for removing those intervals from the forest so that they are eliminated from further consideration. The pseudocode block 394 in FIG. 9 implements the bitmap logic in exactly the same steps as in the straight-line embodiment (step 158 in FIG. 4; steps 212 through 238 in FIG. 5). If a bitmap node has been created (step 398 in FIG. 9), the remaining block 396 in FIG. 9 is bypassed, and the function returns to EncodeForest so that the rest of the forest may be encoded. The pseudocode block 396 in FIG. 9 is identical in substance to the straight-line method beginning with step 162 in FIG. 4, the only difference being the use of function recursion instead of stacks to manipulate context. Briefly, the forest set is examined for new common leading bytes, and Tree_Set is assembled from the intervals that share those bytes (step 400 in FIG. 9). The number of common leading bytes already encoded in the forest's ancestry has been provided by EncodeForest (step 392 in FIG. 9; step 378 in FIG. 8). If Tree_Set is empty (step 402 in FIG. 9), a non-singleton interval node is created (block 414 in FIG. 9), the interval is removed from the forest set (step 416 in FIG. 9), and the function returns to EncodeForest to encode the rest of the forest. If Tree_Set is not empty, a new tree node is created (block 404 in FIG. 9). If any bytes remain (step 406 in FIG. 9), the child forest of the new parent node is encoded by a recursive call to EncodeForest (step 408 in FIG. 9). The new context for this new depth level in the abstract tree is established simply by passing Tree_Set as the new forest, and the new total (step 405 in FIG. 9) for Common_Bytes_Encoded. When EncodeForest returns from encoding the child forest, the END-OF-TREE byte is emitted (step 410 in FIG. 9). Whether the tree node was a singleton leaf or the parent of a child forest, the interval(s) in Tree_Set are then removed from the current forest (step 412 in FIG. 9) before the function returns to EncodeForest.

Figure 6A:
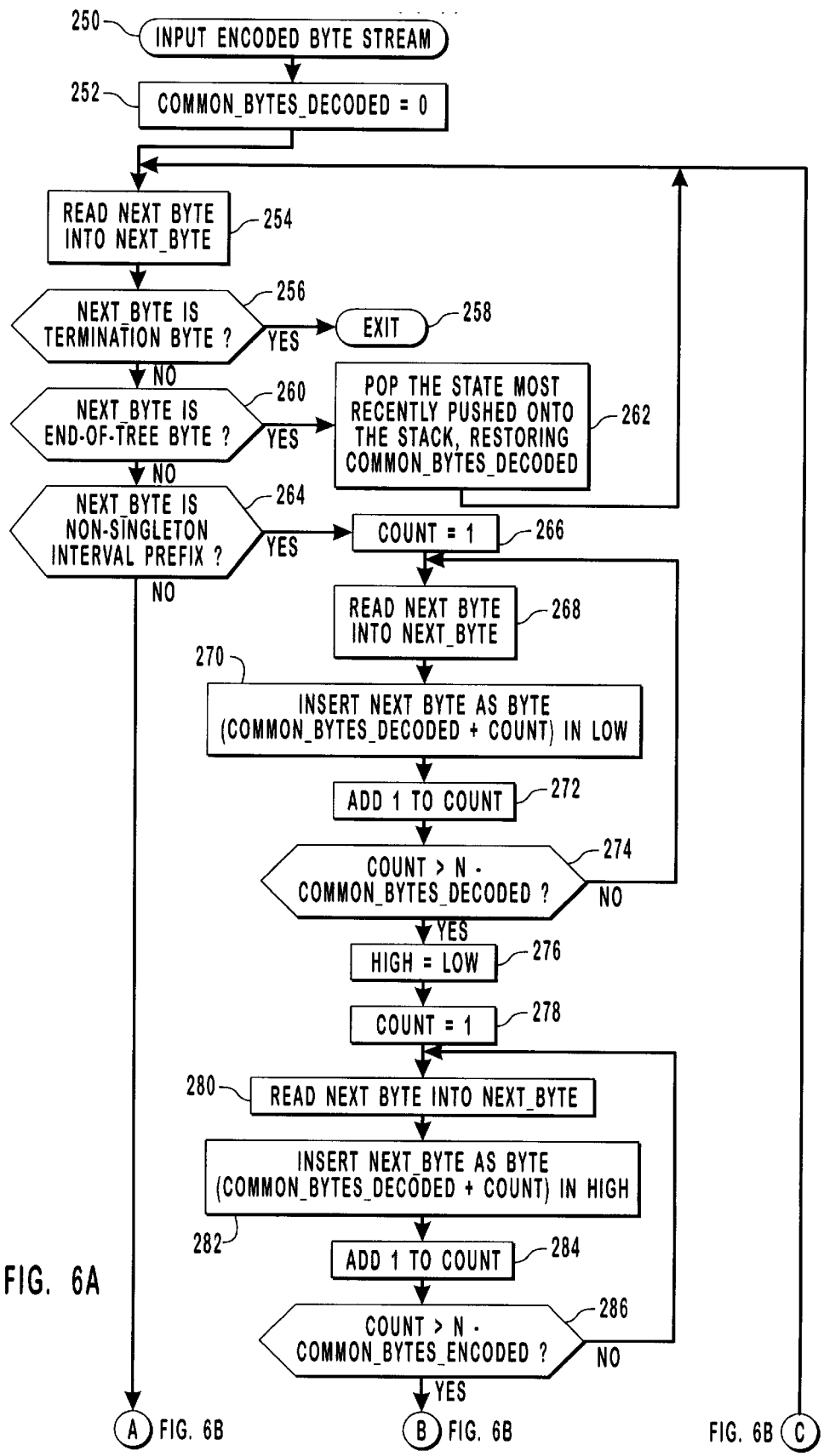
FIG. 6 is a flowchart diagram depicting the method of decoding a stream of bytes, such as the byte stream of FIG. 3, that has been produced by the encoding method as depicted in FIG. 4.
Figure 6B:
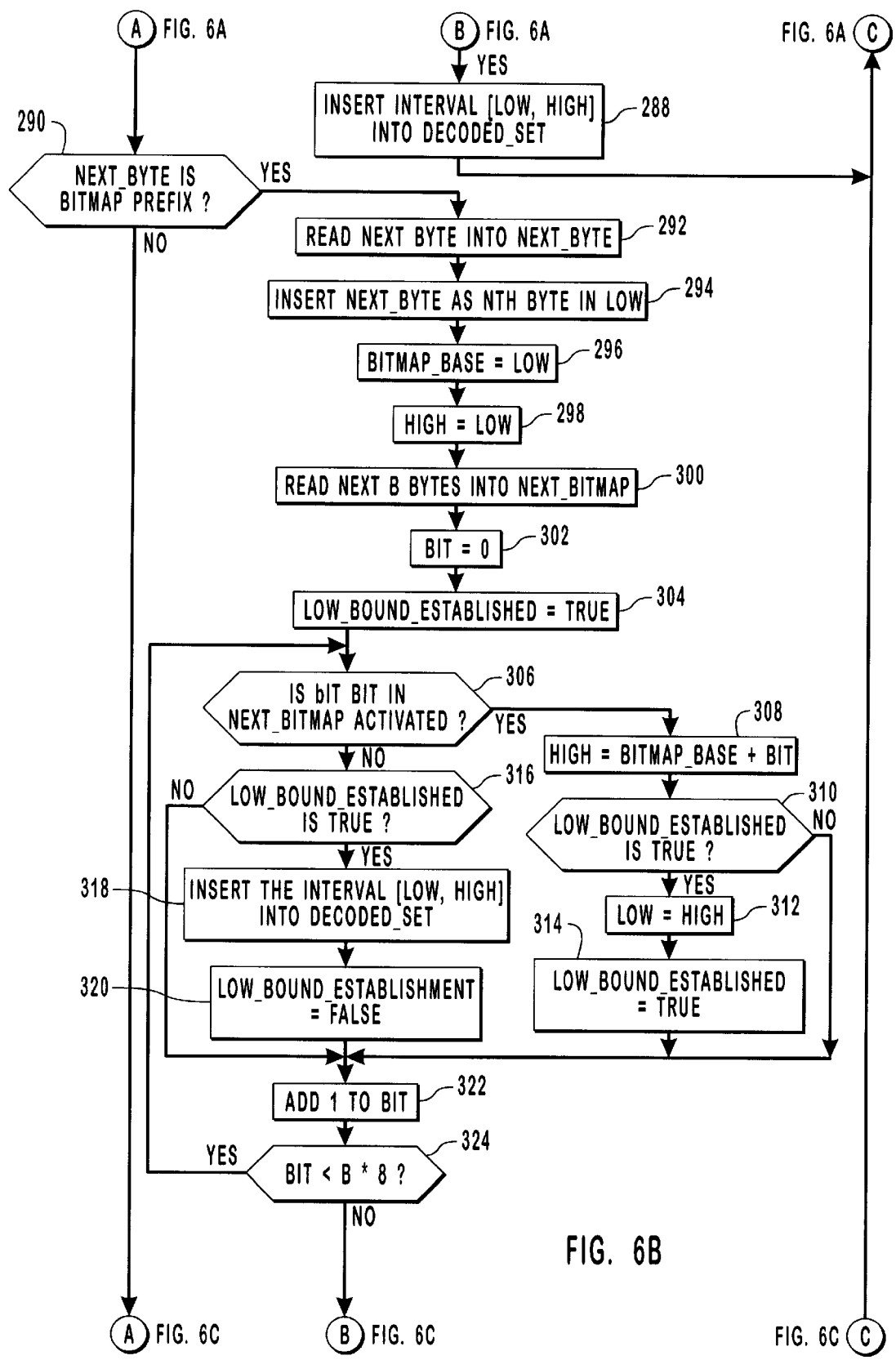
Figure 6C:
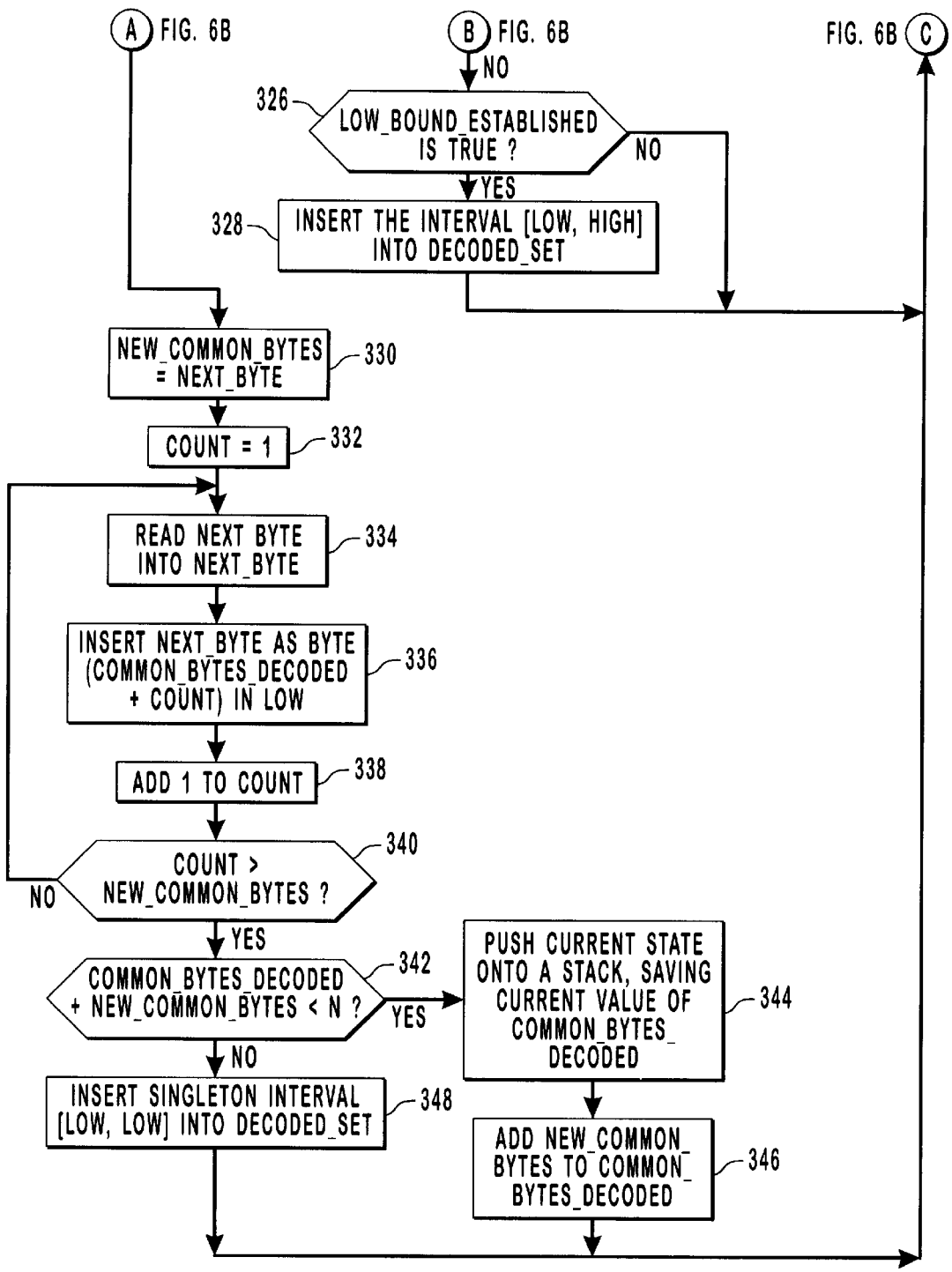

The preferred decoding technique is shown in FIGS. 3 and 6. The decoding technique operates on a stream of bytes such as the encoded example shown in FIG. 3. The preferred technique is shown both as a straight-line implementation in flowchart form (FIG. 6) and in pseudocode (FIG. 10). Both drawings show the identical steps. Unlike the pseudocode implementation of the encoding scheme, the pseudocode implementation of the decoding scheme uses no recursion and consists of only one function DecodeSet whose body contains exactly the steps depicted in the flowchart form. For brevity in the following discussion, references are made only to the flowchart embodiment (FIG. 6).

The method performs a depth-first search of the tree represented by the encoded byte stream. It builds up an integer byte by byte as it reads in tree nodes with common leading bytes. When it encounters a leaf node, it can fill in all the remaining bytes and insert into the decoded set the singleton, the non-singleton interval, or the bitmap members that are represented by that leaf.

The method is really just a big loop that reads the next byte from the byte stream (step 254 in FIG. 6) and dispatches on that byte. If it is the termination byte, the method exits (steps 256 through 258). If it is the END-OF-TREE byte, the method pops the most recently saved value of Common_Bytes_Encoded off the stack (steps 260 through 262). Common_Bytes_Encoded is initialized at 0 (step 252), is incremented as the method encounters parent tree nodes containing common bytes, and is restored when the method finishes decoding the children of a tree and must move on to decode any siblings. If the byte is the non-singleton interval prefix, the method performs the steps for decoding a non-singleton interval leaf node (steps 264 through 288). If the byte is the bitmap prefix, the method performs the steps for decoding a bitmap leaf node (steps 290 through 328). If the byte is none of these special bytes, it must be a prefix for a tree node containing additional common leading bytes, either a parent node or a singleton leaf node; the method deals with this "catch-all" case in steps 330 through 346.

Using the example, the first byte 70 is '02'. This is a prefix byte that falls into the catch-all case (step 330). The prefix declares that the two bytes that follow are the common bytes (step 330), so these bytes 72, 74 are read and placed into the proper byte positions of Low (steps 332 through 340), an integer that is assembled byte by byte. With the addition of these new common bytes, if all N bytes in Low have been assigned then this must be a singleton leaf node; the singleton interval is inserted into the decoded set (steps 342, 348), and control returns to the top of the main loop. In the example, there are still 2 bytes unassigned in Low. Thus, the method must continue its depthwise traversal, interpreting subsequent bytes as child nodes of the parent tree node just decoded. FIG. 2 shows the position of this parent node 40 in the tree. The method pushes the current number of common bytes encoded (0) onto the state stack (step 344) so that Common_Bytes_Decoded may be restored when this new tree is fully decoded. Finally, Common_Bytes_Encoded is incremented from 0 to 2 to reflect the fact that 2 bytes have been assigned at the tree level at which the method is now operating.

The next byte 76 is the non-singleton interval prefix, indicating that the next node is a non-singleton interval leaf. FIG. 2 shows this leaf node 42 in the tree. Since Low has N−Common_Bytes_Decoded bytes left to be assigned, the method reads in that number of bytes and assigns them to the proper byte positions in Low (steps 266 through 274). It then does the same for High (steps 278 through 286), once it has initialized the first Common_Bytes_Encoded bytes of High to be the same as for Low (step 276). The interval with bounds Low and High is then inserted into the decoded set.

The next byte 86 is '02', another prefix for the catch-all case. This time, it is a singleton leaf node. FIG. 2 shows this leaf node 44 in the tree. The next two bytes 88, 90 are read and assigned to Low (steps 332 through 340). The singleton interval, in which both bounds are equal to Low, is inserted into the decoded set (step 348).

The next byte 92 is '01', another prefix for the catch-all case. This time, it is not a singleton node. FIG. 2 shows this parent node 46 in the tree. The one byte 94 is read into the third byte of Low. Common_Bytes_Decoded is again pushed onto the stack, and is then incremented to 3.

The next byte 96 is '01', a prefix for the catch-all case: another singleton node. FIG. 2 shows this singleton node 50 in the tree. The byte 98 for this node is read into Low, and the singleton is inserted into the decoded set.

The next byte 100 is the non-singleton interval prefix indicating another leaf node. FIG. 2 shows the leaf node 52 in the tree. The remaining low byte 102 and high byte 104 are read, and the new interval is inserted into the decoded set.

The next byte 106 is the END-OF-TREE byte, signaling the end of the tree started by node 46 shown in FIG. 2. The stack is popped (step 262), restoring Common_Bytes_Decoded to 2.

The next byte 108 is '01', another prefix for the catch-all case. It is the parent tree node 48 shown in FIG. 2. The one common byte 110 is read into the third byte of Low. Common_Bytes_Decoded is pushed onto the stack and then incremented to 3.

The next byte 112 is the bitmap prefix indicating a bitmap leaf node. FIG. 2 shows the bitmap node 54 in the tree. The next byte 114 is read into the remaining byte of Low (steps 292 through 294); the completed integer is saved as Bitmap_Base (step 296). The next B bytes are read to form a bitmap (step 300). The method then loops through each bit position; if the bit is active then Bitmap_Base+Bit+1 must be in the set. The complexity arises from the need to arrange contiguous integers into intervals rather than insert them into the decoded set as individual singletons. It would be possible to defer such arranging until after the decoding is complete by scanning the set for contiguous integers not yet configured into intervals. However, the preferred embodiment performs the task straightaway. The logic embodies in steps 298 through 328 in FIG. 6 is as follows. If the low bound of the next interval to be inserted is known, then the high bound gets incremented with each consecutive active bit. As soon as an inactive bit is encountered, or if there are no more bits in the bitmap, then the interval must necessarily have ended. The interval is then inserted with the low and high bounds as they existed before the inactive bit was encountered, or before the bitmap ran out of bits. Once an inactive bit or "hole" in the sequence is encountered, and the interval inserted, the low bound is no longer known. When and only when another active bit is encountered will the low bound be established; when it is, the high bound is initialized to be equal to the low bound, and the process continues. The logic always begins with the low bound established; it is equal to Bitmap_Base. In the example, the base is 0x14000. The very first bit is inactive, so the singleton interval 0x14000 is inserted into the set. The next bit is active, so the low bound is newly established as 0x14002. The following bit is also active, so the high bound is incremented to 0x14003. But the subsequent bit is inactive, so the non-singleton interval [0x14002, 0x14003] is inserted into the decoded set. The following bit is active, so the low bound is again established as 0x14005. But the next bit is inactive, so the singleton interval 0x14005 is inserted into the decoded set. None of bits 5 through 7 is active, so no low bound is again established; no more intervals are inserted based on this bitmap.

The next byte 118 is the END-OF-TREE byte, signaling the end of the tree started by node 48 shown in FIG. 2. The stack is popped (step 262), restoring Common_Bytes_Decoded to 2.

The next byte 120 is also the END-OF-TREE byte, signaling the end of the top-level tree started by node 40 shown in FIG. 2. The stack is popped (step 262), restoring Common_Bytes_Decoded to 0.

The next byte 122 is the termination byte, signaling the end of the encoding.

Other embodiments are within the scope of the following claims. For example, the input set has been described herein as a set of integer intervals. However, the set might consist purely of integers, such that contiguous integers that conceptually comprise an interval would actually appear individually in the set. The invention could itself detect a plurality of contiguous integers and translate those integers into an interval for encoding purposes.

What is claimed is:

1. A computer implemented method of compressing a data stream that includes a set of integers in order to produce a compressed byte stream, the method comprising the steps of:

examining the data stream to identify a subset of integers that share one or more common leading bytes;

general a first group of bytes that represents the common leading bytes of the identified subset of integers, the first group of bytes comprising only a single instance of the common leading bytes in order to compress the overall data stream;

generating a second group of bytes that represents a truncated form of the integers of the identified subset, the truncated form resulting from removal of the common leading bytes; and generating a compressed byte stream that includes the first and second groups of bytes.

2. The method of claim 1, wherein the set of integers included in the data stream comprises a subset of one or more contiguous integers represented as an interval comprising a low bound and a high bound.

3. The method of claim 1, wherein the set of integers included in the data stream comprises integers arranged in sorted order, and no integer in the set appears more than once.

4. The method of claim 1, further comprising the steps of:

examining the integers in truncated form in the second group of bytes to identify a subset of truncated integers that share one or more common leading bytes;

generating a third group of bytes that represents the common leading bytes of the identified subset of truncated integers, the third group of bytes comprising only a single instance of the common leading bytes of the identified subset of truncated integers to further compress the overall data stream;

generating a fourth group of bytes that represents a further truncated form of the truncated integers of the identified subset of truncated integers, the further truncated form resulting from removal of the common leading bytes of the identified subset of truncated integers; and including the third and fourth groups of bytes in the compressed byte stream.

5. The method of claim 1, wherein according to a tree model representation of the compressed byte stream, the bytes of the compressed byte stream comprise at least one tree, one node, and a plurality of leaves.

6. The method of claim 1, wherein the integers represent database record IDs.

7. The method of claim 1, wherein the step of generating the second group of bytes includes a step of representing the truncated form of the integers of the identified subset using a bitmap, comprising the steps of:

selecting the lowest-value integer of the identified subset as a bitmap reference point and including the truncated form of the selected lowest-value integer in the second group of bytes;

creating a bitmap having a size of one byte or larger, wherein each of the integers in the identified subset, other than the lowest-value integer, is mapped in the bitmap; and including the bitmap in the second group of bytes.

8. A computer implemented method of compressing a data stream that includes a set of integers in order to produce a compressed byte stream, the method comprising the steps of:

examining the data stream to identify a subset of integers that share one or more common leading bytes that are suited for representation using a bitmap having a size equal to a selected number of bytes;

generating a first group of bytes that represents the common leading bytes of the identified subset of integers, the first group of bytes comprising only a single instance of the common leading bytes in order to compress the overall data stream;

generating a second group of bytes that represents a truncated form of the integers of the identified subset, the truncated form resulting from removal of the common leading bytes, comprising the steps of:

selecting the lowest-value integer of the identified subset as a bitmap reference point and including the truncated form of the selected lowest-value integer in the second group of bytes;

creating a bitmap having a size equal to the selected number of bytes, wherein each of the integers in the identified subset, other than the lowest-value integer, is mapped in the bitmap; and including the bitmap in the second group of bytes; and generating a compressed byte stream that includes the first and second groups of bytes.

9. The method of claim 8, wherein the set of integers included in the data stream comprises a subset of one or more contiguous integers represented as an interval comprising a low bound and a high bound.

10. The method of claim 8, wherein the set of integers included in the data stream comprises integers arranged in sorted order, and no integer in the set appears more than once.

11. The method of claim 8, wherein the bitmap is created by selectively setting the state of particular bits in the bitmap in order to specify the value, I, of each of the integers in the identified subset, other than the lowest-value integer, according to the function I(b,r)=r+b+1, where r is the bitmap reference point and b is the position of the particular bit in the bitmap.

12. The method of claim 8, wherein the integers represent database record IDs.

13. A computer program, residing on a computer readable medium, for compressing a data stream that includes a set of integers in order to produce a compressed byte stream, the computer program comprising instructions for executing the steps of:

examining the data stream to identify a subset of integers that share one or more common leading bytes;

generating a first group of bytes that represents the common leading bytes of the identified subset of integers, the first group of bytes comprising only a single instance of the common leading bytes in order to compress the overall data stream;

generating a second group of bytes that represents a truncated form of the integers of the identified subset, the truncated form resulting from removal of the common leading bytes; and generating a compressed byte stream that includes the first and second groups of bytes.

14. The computer program of claim 13, wherein the set of integers included in the data stream comprises a subset of one or more contiguous integers represented as an interval comprising a low bound and a high bound.

15. The computer program of claim 13, wherein the set of integers included in the data stream comprises integers arranged in sorted order, and no integer in the set appears more than once.

16. The computer program of claim 13, further comprising instructions for executing the steps of:

examining the integers in truncated form in the second group of bytes to identify a subset of truncated integers that share one or more common leading bytes;

generating a third group of bytes that represents the common leading bytes of the identified subset of truncated integers, the third group of bytes comprising only a single instance of the common leading bytes of the identified subset of truncated integers to further compress the overall data stream;

generating a fourth group of bytes that represents a further truncated form of the truncated integers of the identified subset of truncated integers, the further truncated form resulting from removal of the common leading bytes of the identified subset of truncated integers; and including the third and fourth groups of bytes in the compressed byte stream.

17. The computer program of claim 13, wherein according to a tree model representation of the compressed byte stream, the bytes of the compressed byte stream comprise at least one tree, one node, and a plurality of leaves.

18. The computer program of claim 13, wherein the integers represent database record IDs.

19. The computer program of claim 13, wherein the step of generating the second group of bytes includes a step of representing the truncated form of the integers of the identified subset using a bitmap, comprising the steps of:

selecting the lowest-value integer of the identified subset as a bitmap reference point and including the truncated form of the selected lowest-value integer in the second group of bytes;

creating a bitmap having a size of one byte or larger, wherein each of the integers in the identified subset, other than the lowest-value integer, is mapped in the bitmap; and including the bitmap in the second group of bytes.

20. A computer program, residing on a computer readable medium, for compressing a data stream that includes a set of integers in order to produce a compressed byte stream, the computer program comprising instructions for executing the steps of:

examining the data stream to identify a subset of integers that share one or more common leading bytes and that are suited for representation using a bitmap having a size equal to a selected number of bytes;

generating a first group of bytes that represents the common leading bytes of the identified subset of integers, the first group of bytes comprising only a single instance of the common leading bytes in order to compress the overall data stream;

generating a second group of bytes that represents a truncated form of the integers of the identified subset, the truncated form resulting from removal of the common leading bytes comprising the steps of:

selecting the lowest-value integer of the identified subset as a bitmap reference point and including the truncated form of the selected lowest-value integer in the second group of bytes;

creating a bitmap having a size equal to the selected number of bytes, wherein each of the integers in the identified subset, other than the lowest-value integer, is mapped in the bitmap; and including the bitmap in the second group of bytes; and generating a compressed byte stream that includes the first and second groups of bytes.

21. The computer program of claim 20, wherein the set of integers included in the data stream comprises a subset of one or more contiguous integers represented as an interval comprising a low bound and a high bound.

22. The computer program of claim 20, wherein the integers included in the data stream comprises integers arranged in sorted order, and no integer in the set appears more than once.

23. The computer program of claim 20, wherein the bitmap is created by selectively setting the state of particular bits in the bitmap in order to specify the value, I, of each of the integers in the identified subset, other than the lowest-value integer according to the function I(b, r)=r+b+1, where r is the bitmap reference point and b is the position of the particular bit in the bitmap.

24. The computer program of claim 20, wherein the integers represent database record IDs.

25. A computer implemented method of compressing a set of integers to produce an encoded byte stream, the method comprising:

selecting a subset of integers suited for bitmap representation;

selecting a reference point; and creating a bitmap of one or more bytes in which the state of a particular bit represents whether a particular integer is contained in the subset and in which the location of the particular bit in the bitmap represents the location of the integer relative to the reference point, wherein the integer whose location is relative to the reference point is given by the function $I(b,r)=r+b+1$, where r is the reference point and b is the bit position in the bitmap.

26. A computer program, residing on a computer readable medium, for compressing a set of integers to produce an encoded byte stream, the computer program comprising instructions for:

selecting a subset of integers suited for bitmap representation;

selecting a reference point; and creating a bitmap of one or more bytes in which the state of a particular bit represents whether a particular integer is contained in the subset and in which the location of the particular bit in the bitmap represents the location of the integer relative to the reference point, wherein the integer whose location is relative to the reference point is given by the function $I(b,r)=r+b+1$, where r is the reference point and b is the bit position in the bitmap.

* * * * *

UNITED STATES PATENT AND TRADEMARK OFFICE
CERTIFICATE OF CORRECTION

PATENT NO. : 5,940,833

DATED : August 17, 1999

INVENTOR(S) : Max L. Benson

It is certified that error appears in the above-identified patent and that said Letters Patent is hereby corrected as shown below:

Title page, item [56], 3 lines from bottom after "Keeps" change "and" to --an--

Col. 1, ln. 14: after "are the" change ""array"and" to --"array" and--

Col. 13, ln. 55: before "a first" change "general" to --generating--

Col. 16, ln. 52: after "wherein the" insert --set of--

Signed and Sealed this

Twentieth Day of June, 2000

Attest:

Q. TODD DICKINSON

*Attesting Officer*      *Director of Patents and Trademarks*